United States Patent
Reineke et al.

[19]

[11] Patent Number: 6,147,433

[45] Date of Patent: Nov. 14, 2000

[54] METHOD AND DEVICE FOR CHARGING AND DISCHARGING A PIEZOELECTRIC ELEMENT

[75] Inventors: Jörg Reineke; Alexander Hock, both of Stuttgart, Germany

[73] Assignee: Robert Bosch GmbH, Stuttgart, Germany

[21] Appl. No.: 09/269,682

[22] PCT Filed: Apr. 24, 1998

[86] PCT No.: PCT/DE98/01158

§ 371 Date: Jun. 22, 1999

§ 102(e) Date: Jun. 22, 1999

[87] PCT Pub. No.: WO99/07026

PCT Pub. Date: Feb. 11, 1999

[30] Foreign Application Priority Data

Aug. 2, 1997 [DE] Germany ............... 197 33 560

[51] Int. Cl.[7] .................................................. H01L 41/09
[52] U.S. Cl. ....................... 310/316.03; 310/317
[58] Field of Search ................... 310/316.03, 317

[56] References Cited

U.S. PATENT DOCUMENTS

| 4,732,129 | 3/1988 | Takigawa et al. | 310/316.03 |
| 4,767,959 | 8/1988 | Sakakibara et al. | 310/317 |
| 4,947,074 | 8/1990 | Suzuki | 310/316.03 |
| 5,130,598 | 7/1992 | Verheyen | 310/316.03 |

FOREIGN PATENT DOCUMENTS

| 0 371 469 | 6/1990 | European Pat. Off. | H01L 41/04 |
| 0 379 182 | 7/1990 | European Pat. Off. | H01L 41/04 |
| 0 871 230 | 10/1998 | European Pat. Off. | H01L 41/08 |
| 44 35 832 | 4/1996 | Germany | H02M 3/10 |
| 4-071859 | 6/1992 | Japan | B41J 2/30 |

*Primary Examiner*—Thomas M. Dougherty
*Attorney, Agent, or Firm*—Kenyon & Kenyon

[57] ABSTRACT

A method and a device for charging and discharging a piezoelectric element are described. The charging current charging the piezoelectric element and the discharging current discharging the piezoelectric element, respectively, are conducted via a component having inductive properties. switch provided in the charging circuit or a switch provided in the discharging circuit is repeatedly actuated in such a way during the charging and the discharging, respectively, that the piezoelectric element is brought to a predetermined voltage by a predetermined average charging or discharging current.

7 Claims, 5 Drawing Sheets

METHOD AND DEVICE FOR CHARGING AND DISCHARGING A PIEZOELECTRIC ELEMENT

FIELD OF THE INVENTION

The present invention relates to a method and a device for charging and discharging a piezoelectric element, the charging current charging the piezoelectric element, and respectively, the discharging current discharging the piezoelectric element, being led via a component having inductive properties.

The piezoelectric elements further discussed here particularly include, but are not limited to piezoelectric elements, which are used as actuators, i.e. final control elements. Piezoelectric elements can be used for such purposes due to their known property to contract or expand in dependence on an applied voltage.

BACKGROUND INFORMATION

Realizing final control elements by piezoelectric elements in practice proves to be advantageous particularly if the respective final control element must perform quick and/or frequent movements.

Using piezoelectric elements as a final control element proves to be advantageous in fuel injection nozzles for internal combustion engines, among other uses. The usability of piezoelectric elements in fuel injection nozzles, is described in, for example, to European Patents EP 0 371 469 B1 and EP 0 379 182 B1.

Piezoelectric elements are capacitive consumers, which, as described above, contract or expand, depending on the charge state in each case, i.e., depending on the emerging or applied voltage.

The charging and discharging of a piezoelectric element can occur, among other ways, via a component having inductive properties, such as a coil, this coil primarily serving to limit the charging current occurring during charging as well as the discharging current occurring during discharging. Such an arrangement is shown in FIG. 8.

Figure 8:
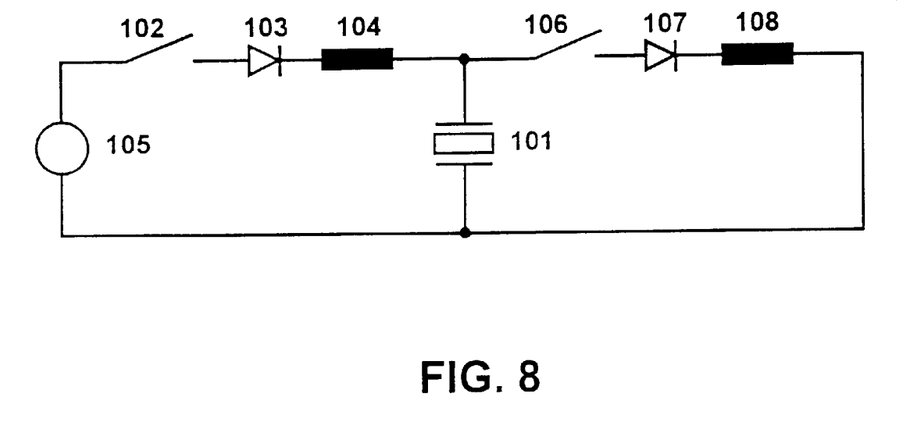
FIG. 8 shows a conventional arrangement for charging and discharging a piezoelectric element.

The piezoelectric element to be charged or to be discharged is referred to in FIG. 8 with the reference symbol 101. It is 10 part of a charging circuit, which can be closed by a charging switch 102, and of a discharging circuit, which can be closed by a discharging switch 106. The charging circuit includes a charging switch 102, a diode 103, a charging coil 104, piezoelectric element 101 and a voltage source 105, connected in series. The discharging circuit includes a discharging switch 106, a diode 107, a discharging coil 108 and piezoelectric element 101, connected in series.

Diode 103 of the charging circuit prevents the flow of a current in the charging circuit, which would discharge the piezoelectric element. Diode 103 and charging switch 102 can be executed together as a semiconductor switch.

Diode 107 of the discharging circuit prevents the flow of a current in the discharging circuit, which would charge the piezoelectric element. Diode 107 and charging switch 106 can be executed together as a semiconductor switch.

When the normally opened charging switch 102 is closed, then a charging current flows in the charging circuit, by which piezoelectric element 101 is charged. The charge stored in piezoelectric element 101, i.e., as a result, the voltage emerging at it, and consequently, the current exterior dimensions of piezoelectric element 101, basically remain unchanged upon charging it (the piezoelectric element).

When the normally opened discharging switch 106 is closed, then a discharging current flows in the discharging circuit, by which piezoelectric element 101 is discharged. The charge state of piezoelectric element 101, i.e., as a result, the voltage emerging at it, and consequently, the current exterior dimensions of piezoelectric element 101, basically remain unchanged upon discharging it (the piezoelectric element).

Such a charging and discharging of piezoelectric elements is advantageous since it can occur with only a small dissipation of power and only a relatively low development of heat for lack of ohmic resistances worth mentioning in the charging circuit and the discharging circuit.

On the other hand, the scale and the time characteristic of the charging and discharging are not always ideal. Disturbances primarily include charging and discharging rates varying in time, more or less distinct transient reactions as well as an only partial or excessive charging and/or discharging of the piezoelectric element, by which even a charging with opposite polarity can occur during discharging.

It should be clear that this not only represents a considerable stress for the piezoelectric element to be charged or discharged, but can also impair its usage to the intended purpose.

SUMMARY

Therefore, an object of the present invention is to provide the method according the definition of the species in patent claim 1 and, respectively, the device according the definition of the species in patent claim 10, in such a way that the charging and discharging of piezoelectric elements in a careful manner and adapted to the individual or changing conditions.

This objective is achieved according to the present invention by providing a method and device in which a switch provided in the charging circuit, or respectively, a switch provided in the discharging circuit, is repeatedly actuated in such a way during the charging, or respectively, during the discharging, that the piezoelectric element is brought to a predetermined voltage by a given average charging, or respectively, discharging current (characterizing portion of patent claim 1), or respectively, Additionally an open-loop or closed-loop control device is provided, which is designed to repeatedly actuate a switch provided in the charging circuit, or respectively, a switch provided in the discharging circuit, in such a way, that the piezoelectric element is brought to a given voltage by a given average charging, or respectively, discharging current.

By repeatedly opening and closing the respective switch, a switched-mode charging, or respectively, discharging is carried out. By that, the function and performance of the component having the inductive properties change.

Heretofore, the inductive element component of an LC series resonant circuit was designed to cooperate with the piezoelectric element, the characteristic curve and the scope of the charging and discharging being exclusively determined by the inductance of the inductive element and the capacitance of the piezoelectric element (charging and discharging were only able to be performed using the first half-wave of current of the first oscillation of the resonant circuit oscillation since further resonant circuit is prevented by the diodes contained in the charging circuit and discharging circuit).

Now (with switched-mode control), according to the present invention the element having inductive properties is used as a temporary energy store, which stores electrical energy (in the form of magnetic energy), which is alternately supplied by the current source (during charging) or the piezoelectric element (during discharging), and, after correspondingly actuating the switch, releases the stored energy in the form of electric energy to the piezoelectric element (during charging), or respectively, to another energy store or an electric consumer (during discharging), the instants and duration (and consequently also the scale) of the energy storage and the energy release being determined by the switch actuation(s).

By that, the piezoelectric element can be charged and discharged to the desired charge state in a sequence of steps of any desired number, length and at any desired intervals.

Consequently, the scale and the time characteristic of the charging and/or discharging can be influenced as desired, in fact, largely independently of the technical data of the component having the inductive properties and of the piezoelectric element.

If the given possibilities are used to the effect that the switches are repeatedly opened and closed in such a way that the piezoelectric element is brought to a predetermined voltage by a predetermined average charging, or respectively, discharging current, then the charging and discharging of piezoelectric elements can be performed without overstressing them and may easily be adapted to the individual or changing conditions.

By at least partially decoupling the scale and the time characteristic of the charging and/or the discharging from the technical data of the element having the inductive properties and of the piezoelectric element, it is further possible to provide only a single element having inductive properties and to use it for both charging and discharging a piezoelectric element. In the conventional method for charging and discharging a piezoelectric element described above, it is not very easy to combine the charging coil and the discharging coil since these have preferably different values of inductance.

The element having the inductive properties can made very small, if required. The low energy storage capacity, i.e., as a result, the quick saturation, can be compensated by providing an increased number of charging and/or discharging cycles.

By that, the arrangement for charging and discharging piezoelectric elements can be built considerably smaller than it was possible heretofore, despite of their improved performance.

BRIEF DESCRIPTION OF THE DRAWINGS

Further advantageous refinements are the subject matter of the dependent claims.

The present invention is further explained in the following on the basis of exemplary embodiments, making reference to the drawing.

DETAILED DESCRIPTION

The piezoelectric elements, whose charging and discharging is described below, can be used as final control elements in fuel injection nozzles (particularly in so-called common rail injectors) of internal combustion engines. However, there is no limitation to such a use of the piezoelectric elements. The piezoelectric elements can be used in any device for any purpose.

Below, it is assumed that the piezoelectric elements expand in response to charging and contract in response to discharging. However, the present invention is of course also usable when the elements contract in response to charging and expand in response to discharging.

An arrangement for charging and discharging a piezoelectric element according to the present invention below is explained with reference to FIG. 1, as illustrated, the arrangement according to the present invention is simplified compared with conventional arrangements. The simplification is facilitated primarily by using the method according to the present invention, and respectively, the device according to the present invention.

Figure 1:
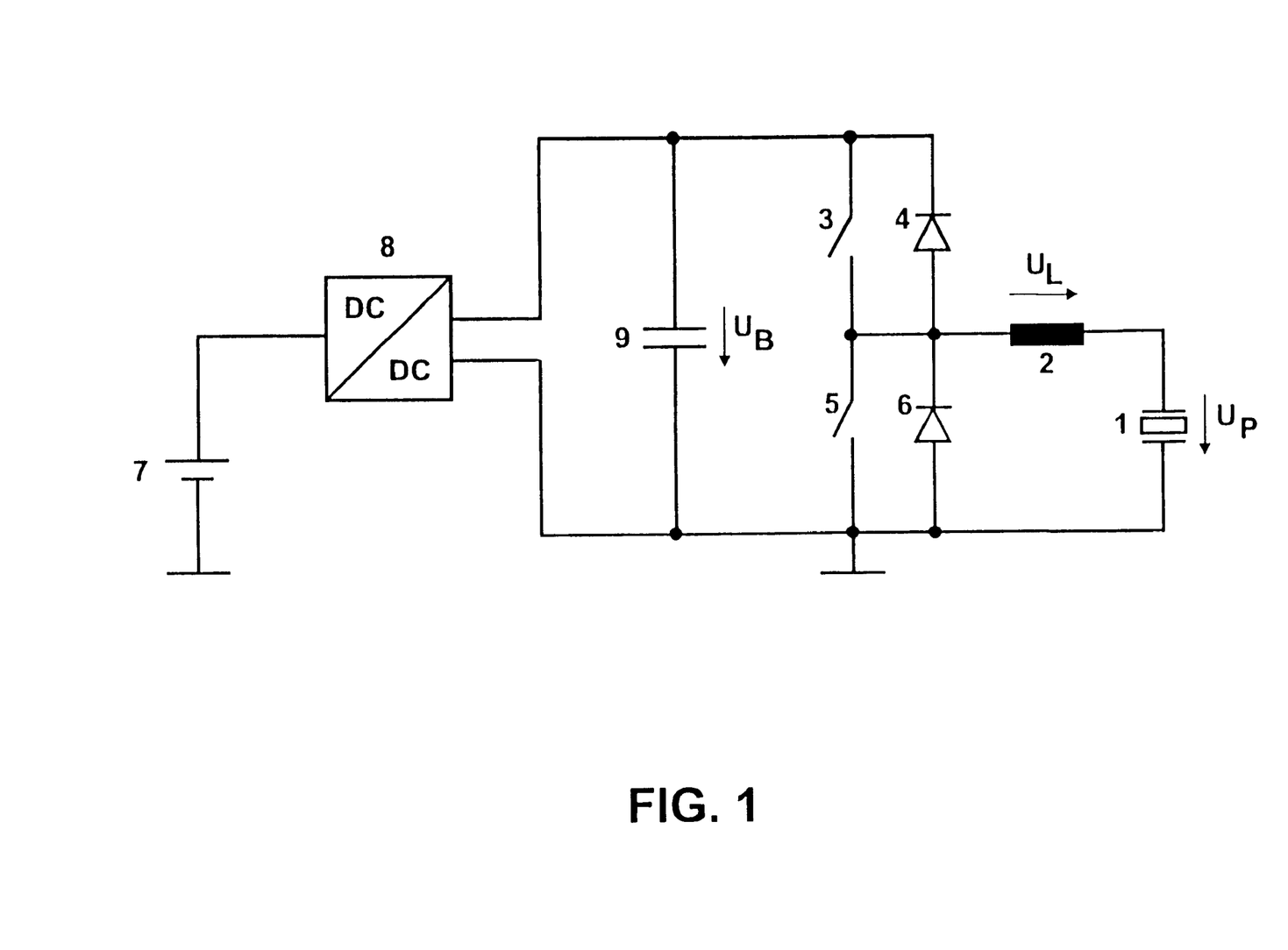
FIG. 1 shows an arrangement for charging and discharging a piezoelectric element, according to the present invention the arrangement having a simplified structure compared with conventional arrangements.

The piezoelectric element, which is to be charged in the discussed example, is referred to with reference symbol 1 in FIG. 1.

As can be gathered from FIG. 1, one of the contacts of the piezoelectric element 1 permanently connected to ground (is connected with a first pole of a voltage source), whereas the other contact of the piezoelectric element is connected to the second pole of the voltage source via a coil 2 (acting as charging and discharging coil at the same time) and a parallel connection of a charging switch 3 and a diode 4, as well as to the first pole of the voltage source via coil 2 and a parallel connection of a discharging switch 5 and a diode 6.

The voltage source includes a a battery 7 (e.g. a motor vehicle battery), a d.c.—d.c. converter 8 connected on load side of the battery and a capacitor 9 serving as a buffer capacitor, connected on load side of the d.c.—d.c. converter. By this arrangement, the battery voltage (e.g. 12 V) is converted into basically any other direct voltage and is provided as a supply voltage.

In this example, the charging and discharging of piezoelectric element 1 occur in switched mode. In particular, charging switch 3 and discharging switch 5 are repeatedly opened and closed during the charging, and respectively, the discharging phase.

Figure 3:
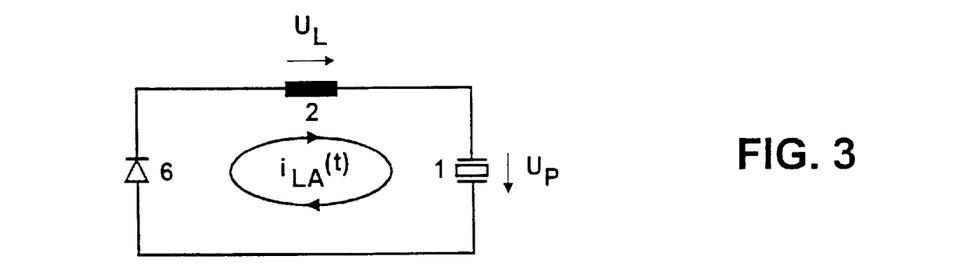
FIG. 3 is a depiction showing the conditions emerging in the arrangement according to FIG. 1 during a second charging phase (charging switch 3 open again).
Figure 4:
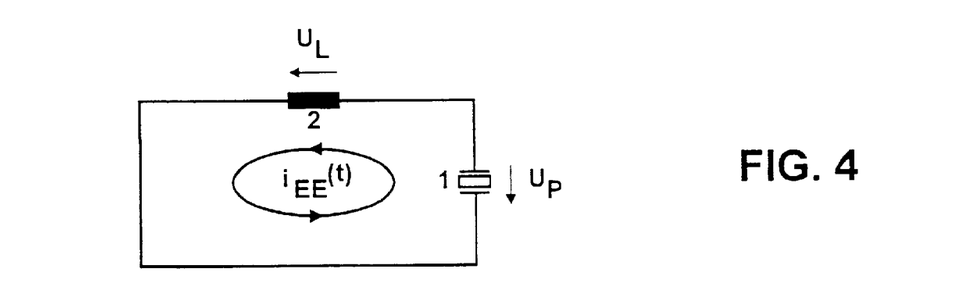
FIG. 4 is a depiction showing the conditions emerging in the arrangement according to FIG. 1 during a first discharging phase (discharging switch 5 closed).
Figure 5:
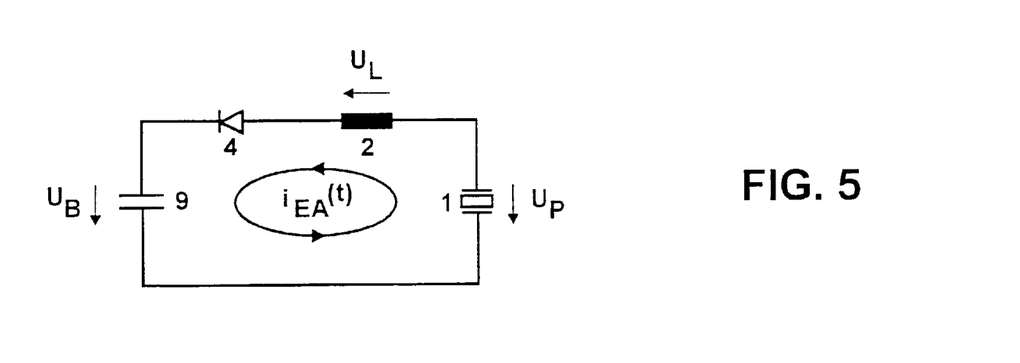
FIG. 5 is a depiction showing the conditions emerging in the arrangement according to FIG. 1 during a second discharging phase (charging switch 5 open again).

The conditions emerging in this process are explained below with reference to FIGS. 2 through 5, FIGS. 2 and 3 thereof illustrating the charging of piezoelectric element 1, and FIGS. 4 and 5 illustrating the discharging of piezoelectric element 1.

Charging switch 3 and discharging switch 5 are open when, and as long as, no charging or discharging of piezoelectric element 1 occurs. In this condition, the circuit shown in FIG. 1 is in steady state. That is, piezoelectric element 1 maintains its charge state basically unchanged, and no currents flow.

Starting with the charging of piezoelectric element 1, charging switch 3 is repeatedly closed and opened. The discharging switch 5 remains opened in this process.

Figure 2:
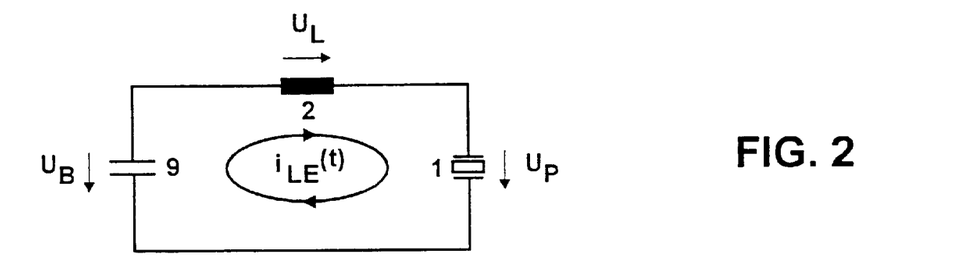
FIG. 2 is a depiction showing the conditions emerging in the arrangement according to FIG. 1 during a first charging phase (charging switch 3 closed).

The closing of charging switch 3 produces the conditions shown in FIG. 2. In particular, a closed circuit is formed of piezoelectric element 1, capacitor 9 and coil 2, connected in series, in which a current $i_{LE}(t)$ flows as indicated by arrows in FIG. 2. This flow of current effects that energy is stored in coil 2. In this process, the energy flow into coil 2 is effected by the positive potential difference between capacitor 9 and piezoelectric element 1.

The opening of charging switch 3 shortly (e.g., several μs) after closing it produces the conditions shown in FIG. 3. A closed circuit is formed of piezoelectric element 1, diode 6 and coil 2, connected in series, in which a current $i_{LA}(t)$ flows as indicated by arrows in FIG. 3. This flow of current effects that the energy stored in coil 2 flows completely into piezoelectric element 1. According to the energy supply to the piezoelectric element, the voltage emerging at it and its exterior dimensions increase. Upon completion of the energy transfer from coil 2 to piezoelectric element 1, the steady state of the circuit according to FIG. 1 is reached again.

Then, or even earlier or later (depending on the desired time characteristic of the charging phase), charging switch 3 is reclosed and reopened, the above described processes repeating themselves. By reopening and reclosing charging switch 3, the energy stored in piezoelectric element 1 increases (the energy already stored in the piezoelectric element and the newly supplied energy add up), and the voltage emerging at the piezoelectric element as well as its exterior dimensions increase accordingly.

If the closing and opening of charging switch 3 are repeated a multitude of times, then the voltage emerging at the piezoelectric element and the extension of the piezoelectric element increase stepwise (with regard to this, see curve A of FIG. 6, which will be explained in detail at a later point).

After charging switch 3 has been closed and opened a predetermined number of times and/or piezoelectric element 1 has reached the desired charge state, then the charging of the piezoelectric element is completed by leaving charging switch 3 open.

If piezoelectric element 1 is to be discharged again, then this is achieved by repeatedly closing and opening discharging switch 5, charging switch 3 remains open in this process.

The closing of discharging switch 5 produces the conditions shown in FIG. 4. In this case, a closed circuit is formed of piezoelectric element 1 and coil 2, connected in series, in which a current $i_{EE}(t)$ flows as indicated by arrows in the Figure. This flow of current effects that the energy stored in the piezoelectric element (a portion of it) is transferred into coil 2. According to the energy transfer from piezoelectric element 1 to coil 2, the voltage emerging at the piezoelectric element and its exterior dimensions decrease.

The opening of discharging switch 5 shortly (e.g. several μs) after closing it produces the conditions shown in FIG. 5. A closed circuit is formed of piezoelectric element 1, capacitor 9, diode 4 and coil 2, connected in series, in which a current $i_{EA}(t)$ flows as indicated by arrows in the Figure. This flow of current effects that the energy stored in coil 2 is completely fed back into capacitor 9. Upon completion of the energy transfer from coil 2 to capacitor 9, the steady state of the circuit according to FIG. 1 is reached again.

Then, or even earlier or later (depending on the desired time characteristic of the discharging phase), discharging switch 5 is reclosed and reopened, the above described processes repeating themselves. By reopening and reclosing discharging switch 5, the energy stored in piezoelectric element 1 further decreases, and the voltage emerging at the piezoelectric element as well as its exterior dimensions also decrease accordingly.

Figure 6:
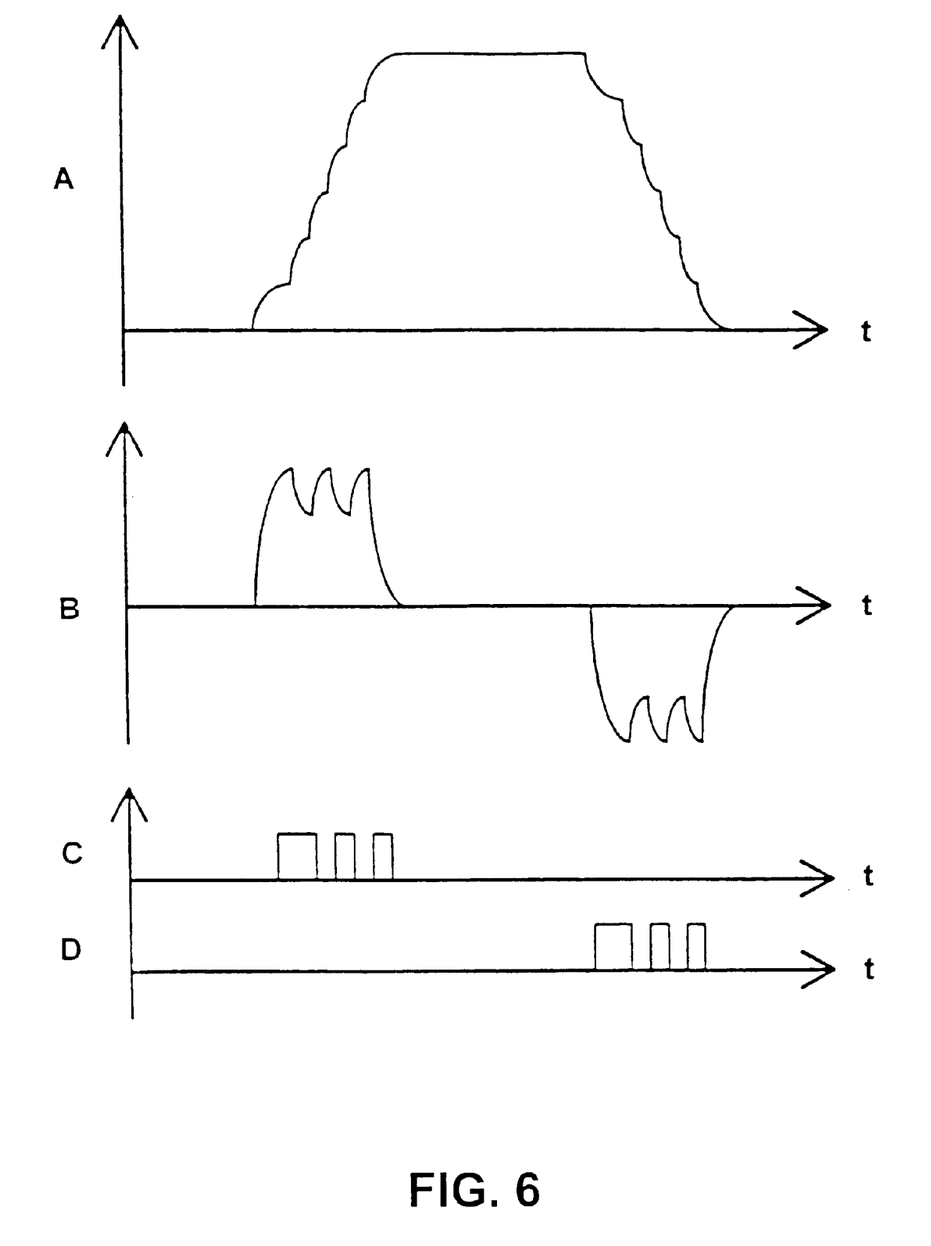
FIG. 6 shows the time characteristic of voltage current curves emerging in controlling the arrangement according to FIG. 1 in accordance with the present invention.

If the described closing and opening of discharging switch 5 are repeated a multitude of times, then the voltage emerging at the piezoelectric element and the extension of the piezoelectric element decrease stepwise (with regard to this, see curve A in FIG. 6).

After discharging switch 5 has been closed and opened a predetermined number of times and/or piezoelectric element 1 has reached the desired charge state, the discharging of the piezoelectric element is completed by leaving discharging switch 5 open.

The scale and the time characteristic of the charging and discharging can be determined by the frequency and duration of the opening and closing of charging switch 3 and discharging switch 5. This applies not only to the arrangement shown in FIG. 1 but also to all arrangements by which piezoelectric elements can be similarly charged and/or discharged. this.

Charging switch 3 and discharging switch 5 are actuated by an open-loop or closed-loop control device not shown in FIG. 1. This open-loop or closed-loop control device opens and closes charging switch 3 and discharging switch 5 in such a way, that the piezoelectric element to be charged or discharged is thereby brought to a predetermined voltage, keeping a predetermined average (charging, or respectively, discharging) current flow.

For this purpose, charging switch 3 and discharging switch 5 are opened and closed at determined instants. The periods during which the respective switches are closed, and the periods during which the respective switches are open, being able to have the same length or to differ in length, and being able to be changed even during one charging or discharging phase in each case, respectively.

The duration and frequency of opening and closing charging switch 3 and discharging switch 5 depend on the structure and the technical data of the arrangement charging, or respectively, discharging the piezoelectric element, as well as on the desired scale and the desired time characteristic of the charging and discharging. The optimal scale and the optimal time characteristic of the charging, or respectively, discharging, in turn, depend on the current operating conditions of the device, in which the piezoelectric element is used.

If the piezoelectric element, as in this case, is used as an actuator in a fuel injection nozzle of a common rail injector of an internal combustion engine, the required scale and the required time characteristic of the charging and discharging vary in depending on 1) the fuel quantity to be injected per injection process,
2) the engine speed,
3) the pressure in the rail, and
4) the engine temperature.

The time the piezoelectric element, should or must be charged or discharged, to what degree, and therefore, that charging or discharging current must flow to have the piezoelectric element charged to the desired degree when the available time has elapsed (at the latest), depends on these parameters Ensuring that the charging, or respectively, discharging current actually flows can be achieved by an open-loop control device or a closed-loop control device. The current flow in both the open-loop control and the closed-loop control may be adjusted by opening and closing the charging switch, or respectively, the discharging switch, in a corresponding frequency and duration.

In the case of an open-loop control, the making and breaking instants and/or the duration of the respective switching states of the charging switch and the discharging switch, or at least a rule for computing them, be determined in advance. For this purpose, a model (equivalent circuit diagram) for the arrangement charging and discharging the piezoelectric element, including the piezoelectric element, for example, is formed or created as arrangement shown in FIG. 1. For the quantities which are relevant in this model, and therefore, for the current charging and, discharging the piezoelectric element, and the voltage consequently emerging at the piezoelectric element, equations (differential equations) are formulated. These equations to compute the instants, at which the charging switch and the discharging switch must be opened and closed, and respectively, how long the charging switch and the discharging switch must remain opened and closed in each case to bring the piezoelectric element to the predetermined voltage by the predetermined current.

The switching instants for the charging switch and the discharging switch can be calculated in advance and can be stored in a memory of the open-loop control device. The stored data can then be read out from the memory during the operation of the piezoelectric element and can be used for the actuation of the switches.

However, the switching instants for the charging switch and the discharging switch can also be calculated immediately before each injection.

In both cases, i.e., in both the calculation of the switching instants in advance as well as the instantaneous calculation of the switching instants, these switching instants can be computed for different operating states, into which the aforementioned parameters enter, on which the desired scale and the desired characteristic of the charging and discharging depend.

The result of both the calculation of the switching instants in advance, as well as the instantaneous calculation of the switching instants, is a charging and discharging of the piezoelectric element as shown in FIG. 6, for example.

In FIG. 6
the curve referred to as A represents the characteristic of the voltage emerging at the piezoelectric element,
the curve referred to as B represents the charging current, and respectively, the discharging current by which the piezoelectric element is charged, or respectively, discharged
the curve referred to as C represents the switching state of the charging switch, and
the curve referred to as D represents the switching state of the discharging switch.

The repeated closing and opening of the charging switch (curve C) occurring as shown produces a fluctuating, but, on average, constantly high charging current (curve B), by which a voltage emerges at the piezoelectric element, the voltage on average steadily increasing to a predetermined final value (curve A). The repeated closing and opening of the discharging switch (curve D) ocurring as shown produces a fluctuating, but, on average, constantly high discharging current (cuver B), by which a voltage emerges at the piezoelectric element, the voltage on average steadily decreasing to a predetermined final value (curve A).

The advantage of the open-loop controlled charging and discharging of a piezoelectric element over the closed-loop controlled charging and discharging of a piezoelectric element is that no sensors are required for tracking the charging, and respectively, the discharging current and the voltage emerging at the piezoelectric element, and that the control cannot be influenced by disturbances.

The "data memory method", in which the switch actuation instants (or the quantities representing them) are stored in a memory, is advantageous in that the control device is not loaded with any computing effort and that miscalculations can be corrected prior to storing.

On the other hand, the advantage of the "calculation method", in which the switch actuation instants (or the quantities representing them) are instantaneously calculated in each case, is that only a small amount of memory space is required in the control device, and that the computed data can be exactly tailored to the conditions (operating states) in each case, requiring comparatively little effort.

If the charging switch and the discharging switch is actuated by a closed-loop control system, the average (set-point) current, by which the piezoelectric element is to be charged and discharged, and the (set-point) final voltage, the piezoelectric element is to reach, are determined. In this determination, the fact is taken into account that the piezoelectric element should, be charged to desired voltage within a predetermined period of time.

If the piezoelectric element, as in this case, is used as an actuator in a fuel injection nozzle of a common rail injector of an internal combustion engine, the predetermined period of time and the desired voltage vary particularly in dependence on
1) the fuel quantity to be injected per injection process,
2) the engine speed,
3) the pressure in the rail, and
4) the engine temperature.

In a closed-loop controlled charging and discharging of the piezoelectric element, the arrangement for charging and discharging the piezoelectric element, as for example the arrangement according to FIG. 1, should be provided with a sensor for measuring the charging, and respectively, the discharging current, as well as the voltage emerging at the piezoelectric element.

The charging and discharging current is then kept within a range around the set-point current $I_{set-point}$, for example by a two-position controller, the range being defined (limited) by a maximum current $I_{max}$ lying above the set-point current and a minimum current $I_{min}$ lying below the set-point current.

The real charging current, or respectively, discharging current $I_{actual}$ measured by the ammeter, is continuously compared with the maximum current $I_{max}$ and the minimum current $I_{min}$. If $I_{actual}$ falls below $I_{min}$ or exceeds $I_{max}$, i.e. if $I_{actual}$ deviates too much from $I_{set-point}$, the actuation of the charging, or respectively, the discharging switch is changed by the closed-loop control device. A current that is too high can be reduced by a shorter/less frequent closing of the charging switch, or respectively, the discharging switch, and a current that is too low can be increased by a longer/more frequent closing of the charging switch, or respectively, the discharging switch. Thus, the piezoelectric element can be charged and discharged by an average, approximately constantly high current.

At the same time, the voltage $U_{actual}$ measured at the piezoelectric element is continuously compared with the set-point final voltage $U_{set-point}$. The charging, and respectively, the discharging process is completed as soon as $U_{actual}$ reaches $U_{set-point}$. In this manner, the piezoelectric element can be brought to a predetermined voltage by an on average approximately constantly high current.

The comparison of $I_{actual}$ with $I_{min}$ and $I_{max}$ and the comparison of $U_{actual}$ with $U_{set-point}$ is performed in analog or digital comparators. The reference values of the comparators, i.e. $I_{min}$, $I_{max}$ and $U_{actual}$ can be set variably, preferably in dependence on the working point, nevertheless being also possible firmly set (invariable) values.

The conditions emerging in the closed-loop controlled charging and discharging of the piezoelectric element correspond to the conditions shown in, and explained making reference to FIG. 6.

By tracking the time characteristic of the input and/or output signals of the comparators, it is possible to determine, (monitor) the time characteristic and/or the progress of the charging or discharging in a particularly simple manner. If the determined time characteristic and/or the progress of the charging and/or discharging deviate from a known normal time characteristic and/or progress, certain kinds of damage and ageing phenomenons of the piezoelectric element(s) to be charged or discharged in each case or of their leads can be inferred from this. In the following, a concrete example is explained making reference to FIG. 7.

Figure 7:
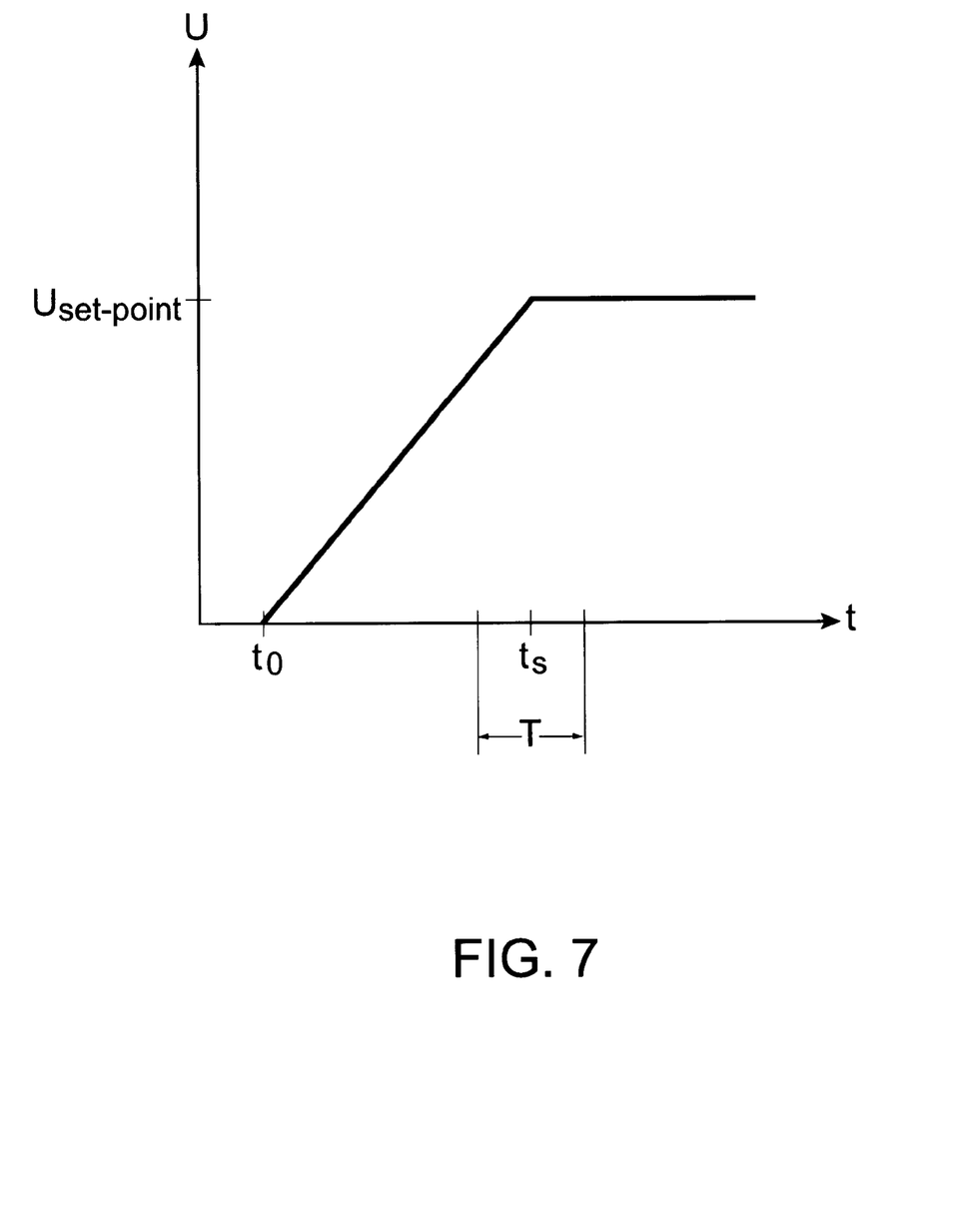
FIG. 7 shows a schematic representation of the time characteristic of the voltage emerging at a piezoelectric element during charging.

FIG. 7 shows the normal characteristic of the voltage emerging at the piezoelectric element during charging. Starting with the charging (instant to), the voltage increases basically linearly to its set-point value $U_{set-point}$. Upon reaching the set-point value $U_{set-point}$, which is the case at the instant $T_s$ in the discussed properly functioning system, the charging process ends.

The period of time, during which the piezoelectric element is be charged to reach voltage $U_{set-point}$ can be determined from the input and/or output signals of the aforementioned comparators.

In the example described above, it is assumed that the piezoelectric element to be charged is made of a multitude of stacked individual elements.

If the set-point voltage is reached approximately at the instant $t_s$ (within a tolerance range reaching from $t_s-\Delta t$ to $t_s+\Delta t$), then the system and its components work properly.

If the set-point voltage is reached before $t_s-\Delta t$, i.e. if the charging time is shorter than the normal charging time, it can be inferred that the piezoelectric element to be charged is damaged or aged, provided that the charging is performed in the usual conditions, particularly with the usual charging current. In fact, the shortened charging time suggests that the piezoelectric element to be charged has a reduced capacity compared with the undisturbed normal case, which, in turn, indicates that one or several of the stacked individual piezoelectric elements have failed or, at least, no longer have their original properties. In fact, piezoelectric elements have capacitive properties, the total capacitance accruing from the sum of capacitances of the individual piezoelectric elements.

An abrupt shortening of the charging time suggests that one or several individual piezoelectric elements are damaged. A gradual shortening of the charging time can be due to damage and also to ageing.

If the set-point voltage is reached after $t_s+\Delta t$, i.e., if the charging time is longer than the normal charging time, then it can be inferred that the lead to the piezoelectric element is damaged, provided that the charging is performed in the usual conditions; in this case, in fact, no, or at least not the desired current, can flow to the piezoelectric element.

The same conclusions can be drawn if, additionally or alternatively, shortened or prolonged discharging times are detected.

It proves to be favorable if the detection of unusually short or long charging and/or discharging times is used as an opportunity to warn of a possible failure or an already occurred deterioration of the system containing the piezoelectric element in question.

In the described manner, the condition of the piezoelectric element can be checked just by monitoring its charging and/or discharging times. If, following a particular incident or instant, the voltage emerging at the piezoelectric element reaches the set-point voltage already before or only after a predetermined time, it can be positively inferred that the piezoelectric element or its lead does not work properly due to defects or ageing processes. It is even possible to locate the cause of it, The described monitoring is considerably easier than heretofore, when the piezoelectric element could only be checked by measuring it in a test apparatus. The piezoelectric element can be monitored, or respectively, tested in built-in condition during normal operation, and the monitoring, or respectively, the testing can basically be performed without complex supplementary devices, particularly without ammeter or the like.

Arrangements which can be controlled as described above, can be built in a particularly simple manner, since, for lack of strict requirements to be met by the technical data, one and the same coil (coil 2 in the arrangement according to FIG. 1) can be used for charging and discharging the piezoelectric element. By this, the number of components, particularly the number of coils, which is inherently a large number, can be kept at a minimum. Instead of the coil(s,) it is also possible, to use other components having inductive properties, such as repeating coils, transformers, etc., in a correspondingly modified circuit configuration.

Instead of the one piezoelectric element 1, individual or several piezoelectric elements of a multitude of piezoelectric elements, arranged in parallel and selectable via selector switches, can also be charged or discharged in the above described manner The charging switch and the discharging switch as described above, or, to be more precise, by the resulting charging and discharging of the piezoelectric element to a predetermined voltage by a predeterminable average charging, and respectively, discharging current, a charging and discharging can be performed, which is less stressful on the piezoelectric element and can easily be adapted to the individual or changing conditions.

What is claimed is:

1. A method for charging or discharging a piezoelectric element, comprising the steps of:

providing, by a component having inductive properties, at least one of a charging current and a discharging current to the piezoelectric element via at least one of a charging circuit and a discharging circuit;

repeatedly actuating a switch in the at least one of the charging circuit and the discharging circuit so that during at least one of a charging and discharging of the piezoelectric element, the piezoelectric element is brought to a predetermined voltage by at least one of a predetermined average charging current and a predetermined average discharging current;

continuously measuring the at least one of the charging current and discharging current;

readjusting the at least one of the charging current and discharging current by correspondingly opening and closing the switch so that the at least one of the charging current and the discharging current are maintained within a defined range around a set-point current; and measuring a time from one of a particular incident and instant to one of i) the at least one of the charging and discharging current has reached one of an upper limit and lower limit of the defined range, and ii) a voltage at the piezoelectric element reached a set-point voltage.

2. The method according to claim 1, further comprising the step of:

actuating a fuel injection nozzle of an internal combustion engine using the piezoelectric element.

3. The method according to claim 2, further comprising the step of:

determining the at least one of the predetermined average charging current and the predetermined average discharging current as a function of at least one of a fuel quantity to be injected per injection process, a speed of the internal combustion engine, a pressure in a rail, and a temperature of the internal combustion engine.

4. The method according to claim 1, further comprising the steps of:

storing in a memory device values representing instants in time at which the switch is to be actuated;

reading the stored values from the memory device; and actuating the switch as a function of the values.

5. The method according to claim 1, further comprising the steps of:

instantaneously calculating instants in time at which the switch is to be actuated during operation of the piezoelectric element; and actuating the switch as a function of the calculated instants in time.

6. The method according to claim 5, wherein the instantaneously calculating step includes the step of calculating the instants in time as a function of an operating state of a device which contains the piezoelectric element.

7. The method according to claim 1, further comprising the step of:

discontinuing the at least one of the charging and discharging of the piezoelectric element when a voltage at the piezoelectric element reaches a set-point voltage.

* * * * *

UNITED STATES PATENT AND TRADEMARK OFFICE
CERTIFICATE OF CORRECTION

PATENT NO.   : 6,147,433
DATED        : November 14, 2000
INVENTOR(S)  : Reineke et al.

Page 1 of 2

It is certified that error appears in the above-identified patent and that said Letters Patent is hereby corrected as shown below:

Abstract,
Line 6, change "... switch ..." to -- A switch --.

Column 2,
Line 29, delete "... the method according the definition of the species in patent claim 1 and, respectively, the device according the definition of the species in patent claim 10 in such a way that the ...".

Column 3,
Line 49, delete "Further advantageous refinements are the subject matter of the dependent claims.
    The present invention is further explained in the following on the basis of exemplary embodiments, making reference to the drawing.".
Line 56, change "... element, ..." to -- element --.
Line 57, change "... invention ..." to -- invention, --.

Column 4,
Line 29, change "..., as illustrated ..." to -- . As illustrated --.
Line 38, change "... can be gathered from ..." to -- shown --.
Line 48, change "... a a ..." to -- a --.

Column 6,
Line 63, change "... that ..." to -- what --.

Column 7,
Line 11, change "... be ..." to -- should be --.
Line 14, delete "... for example ..." and delete "... arrangement ...".
Line 15, change "... FIG. 1." to -- FIG. 1, for example. --.
Line 20, delete "... to ...".

UNITED STATES PATENT AND TRADEMARK OFFICE
CERTIFICATE OF CORRECTION

PATENT NO. : 6,147,433
DATED : November 14, 2000
INVENTOR(S) : Reineke et al.

It is certified that error appears in the above-identified patent and that said Letters Patent is hereby corrected as shown below:

Column 9,
Line 8, change "... nevertheless being also possible firmly set (invariable) values." to -- It is also possible to set fixed (invariable) values. --.
Line 15, change "... determine, ..." to -- determine --.
Line 27, change "... to ..." to -- $t_o$ --.
Line 32, change "... time, ..." to -- time --.

Column 10,
Line 30, change "... possible, ..." to -- possible --.
Line 37, change "... manner" to -- manner. --.

Signed and Sealed this

Ninth Day of October, 2001

*Attest:*

*Attesting Officer*

NICHOLAS P. GODICI
*Acting Director of the United States Patent and Trademark Office*